United States Patent [19]
Truhitte et al.

[11] Patent Number: 5,585,281
[45] Date of Patent: Dec. 17, 1996

[54] PROCESS AND APPARATUS FOR FORMING AND TESTING SEMICONDUCTOR PACKAGE LEADS

[75] Inventors: Darrell Truhitte, Phoenix; Theodore R. Golubic, Glendale; Maureen Sugai, Phoenix, all of Ariz.

[73] Assignee: Motorola, Inc., Schaumburg, Ill.

[21] Appl. No.: 383,141

[22] Filed: Feb. 3, 1995

[51] Int. Cl.⁶ ............................ H01L 23/50; H01L 21/60
[52] U.S. Cl. .............. 437/8; 437/212; 437/249; 29/25.01
[58] Field of Search .................. 437/8, 211, 212, 437/216, 222, 217, 249; 29/25.01

[56] References Cited

FOREIGN PATENT DOCUMENTS

| | | |
|---|---|---|
| 59-52858 | 3/1984 | Japan . |
| 2-81464 | 3/1990 | Japan . |
| 4180643 | 6/1992 | Japan . |

Primary Examiner—George Fourson
Assistant Examiner—David E. Graybill
Attorney, Agent, or Firm—Bruce T. Neel

[57] ABSTRACT

A method of forming leads and providing a final test of a semiconductor package including an electronic circuit therein, the package having unformed leads. A forming and testing station is provided including a support for receiving the package, and dies movably positioned adjacent the support for contacting and forming the leads with test equipment connected to the dies. The semiconductor package is positioned on the support, and the leads of the package are contacted with the dies to connect the test equipment to the leads for testing the electronic circuitry in the package and to form the leads with this contacting step as the final manufacturing step.

8 Claims, 3 Drawing Sheets

PROCESS AND APPARATUS FOR FORMING AND TESTING SEMICONDUCTOR PACKAGE LEADS

The present invention pertains to the formation of leads of a semiconductor package and the testing of the package through the interconnected, formed leads.

BACKGROUND OF THE INVENTION

In the semiconductor industry, once electronic circuits are formed on semiconductor chips and the chips are packaged, it is necessary to completely test the package to ensure correct operation. Generally, the electronic circuits are formed in the semiconductor chip and the chip is attached to a lead frame or the like. The chip is then encapsulated with the leads extending straight out from the package in a common plane. In one prior art process, the circuitry within the package is tested at this time, because it is easier to contact the leads when they are in a common plane, and generally because it is difficult to make contact to preformed leads.

The major problem with this prior method is that the leads are formed after testing of the circuitry is completed. However, in many instances the process of forming the leads causes damage to the leads and, in some instances, can even cause the leads to be loosened from the chip and/or breakage of the encapsulation. Thus, it has become common to perform an open/short test after the lead forming process, which extends the manufacturing and testing procedure and increases the manufacturing costs. However, difficulty in contacting the formed leads applies also to this test. Further, intermittent wire bonds are impossible to detect because the pulling force on the leads that caused the wire bond failure has been relieved when the device left the forming station, which is the final assembly step, and no further testing is performed.

Because devices and packages are becoming smaller, it is becoming even more difficult to make reliable contact on the preformed leads. Contact failure on preformed leads is currently at about 0.5%. Excess contact pressure applied to the leads in an attempt to ensure a reliable electrical contact with the leads has a potential to deform the leads out of specification.

Accordingly, it is desirable to perform tests on semiconductor packages which reliably contact the leads and determine failures caused by formation of the leads.

It is a purpose of the present invention to provide a new and improved lead forming and package testing method.

It is another purpose of the present invention to provide a new and improved lead forming and package testing method in which constant and reliable contact with the leads is made.

It is a further purpose of the present invention to provide a new and improved lead forming and package testing method in which failures caused by lead formation can be determined.

It is still another purpose of the present invention to provide a new and improved lead forming and package testing method in which testing time and expense is reduced.

Yet a further purpose of the present invention is to provide a new and improved lead forming and package testing method which improves detection of lead forming induced failures, including intermittents.

A still further purpose of the present invention is to provide a new and improved lead forming and package testing method in which bending of the leads out of specification is substantially reduced and tested packages can be placed directly into final outgoing packages, i.e. tapes and reels.

SUMMARY OF THE INVENTION

The above problems and others are at least partially solved and the above purposes and others are realized in a method of forming leads and testing circuitry of a semiconductor package, including the steps of providing a semiconductor package including an electronic circuit therein, and the package having unformed leads electrically connected to the circuit, and contacting the leads of the package for testing the package, and forming the leads with the contacting step.

In a specific embodiment of the above method, the step of contacting and forming the leads includes providing a forming and testing station with a support for receiving the package, and dies with electrical test equipment attached thereto movably positioned adjacent the support for contacting and forming the leads. The package is positioned on the support and the station is used for lead forming and final electrical contacting.

BRIEF DESCRIPTION OF THE DRAWINGS

Referring to the drawings.

DESCRIPTION OF THE PREFERRED EMBODIMENTS

Figure 1:
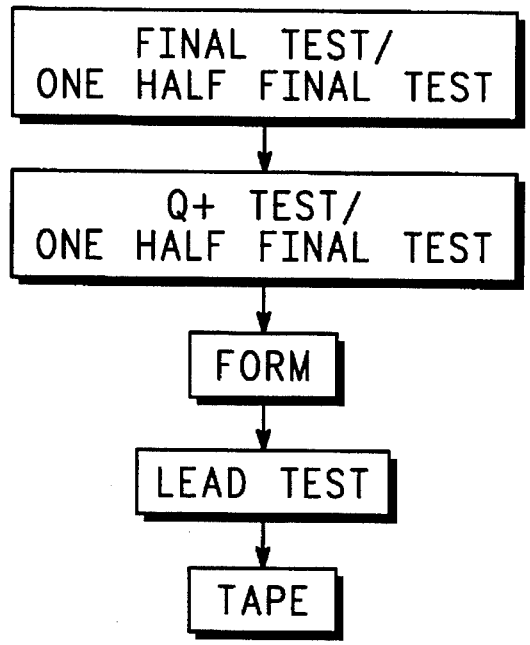
FIG. 1 is a simplified flow chart illustrating a prior art testing and lead forming process.

Referring specifically to FIG. 1, a simplified flow chart of a prior art method of testing and forming leads on a semiconductor package is illustrated. In a first step, subsequent to the fabrication and packaging of the semiconductor device, one half of the final test is performed to determine that the semiconductor device operates properly. A second test is then performed to complete the second half of the final test. Generally, the final test is performed in two steps because it can be accomplished faster and is easier to perform. Also, most catastrophic in-process failures are detected in the first half and the package can be discarded without expending the time and effort required to perform the complete final test.

With the final test completed and the determination made that the package operates satisfactorily, the package is moved to a lead forming station where the leads are formed into the desired final shape. However, because the forming process creates substantial forces on the package and the leads, it is necessary to perform a lead test on the package, which generally tests for shorts and opens in the leads. This test is difficult and unreliable because contacting the preformed leads is difficult, especially with small packages and/or those with many leads. Efforts to increase the reliability of the contacts with the leads by increasing the contact pressure of the testing contacts generally results in many deformed leads and contacts.

Figure 2:
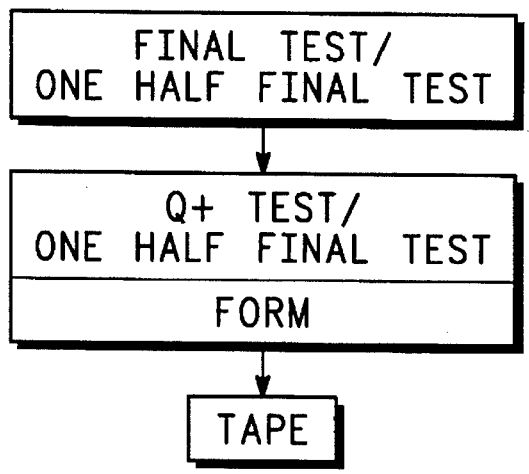
FIG. 2 is a simplified flow chart illustrating a testing and lead forming process in accordance with the present invention.

Referring specifically to FIG. 2, a simplified flow chart is illustrated which shows steps in an improved method embodying the present invention. In the improved method, one half of the final test is performed initially to find semiconductor devices which include problems introduced during manufacturing. It will be understood that this step is optional and that the complete final test could be performed in one step, if desired. However, it has been found that substantial testing time can be saved by performing the first half of the final test in a separate step so as to find semiconductor devices in which a catastrophic in-process failure has occurred and removing them from the process before expending additional testing and forming time.

In the next step of the new and improved method, the second half of the final test is performed during or immediately after the leads are formed. The device forming the leads has test equipment attached to it and, because sufficient pressure must be applied to form the leads, good electrical contact is also made. Thus, the leads are formed and the final test of the package is completed in one step. Because the test is performed during or immediately after the leads are formed, any intermittents, shorts, or opens caused by the forming step are detected in this testing step and an additional test of the leads is not required.

Since no additional testing or reforming of the leads is required, the now completed and quality-verified semiconductor packages are placed directly into final outgoing packages, i.e. tapes and reels, etc. The testing is much more reliable and constant because the lead forming pressure is constant and electrical contact with the leads is constant and reliable. Further, because the final test is performed as the final manufacturing step after the leads are formed, all prior potentially damaging manufacturing steps are successfully screened. This improved method of testing as a final manufacturing step assures quality and outgoing reliability of the final product and substantially reduces the forming and testing time and cost by combining both steps into one.

Figure 3:
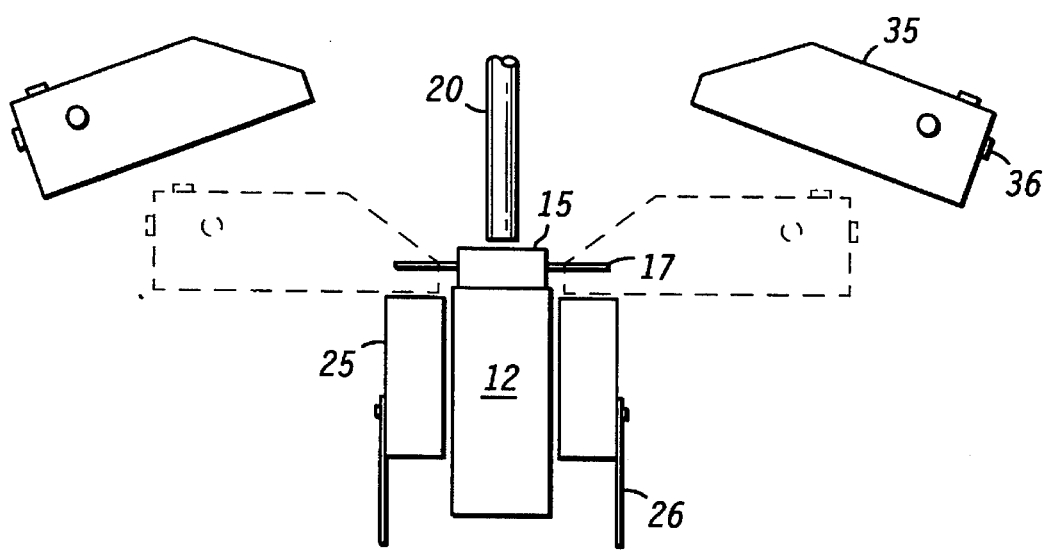
FIG. 3 is a front plan view of a forming/testing station, with semiconductor package in place, prior to lead forming and testing in accordance with the method of FIG. 2.

Referring to FIG. 3, an embodiment of a specific testing and forming station 10 for performing the improved method is illustrated. Station 10 includes a support 12, which is essentially a block shaped structure with a planar upper surface for receiving a semiconductor package 15 thereon. It should be noted that support 12 is appropriately electrically insulated from blocks 25. A vacuum pickup 20, or the like, is utilized to pick semiconductor packages from a feed track or other source and place them in the correct position on the upper surface of support 12. At this point, semiconductor package 15 could be partially tested to ensure that further operations are warranted, and a plurality of leads 17 connected to semiconductor package 15 are as yet unformed.

Figure 4:
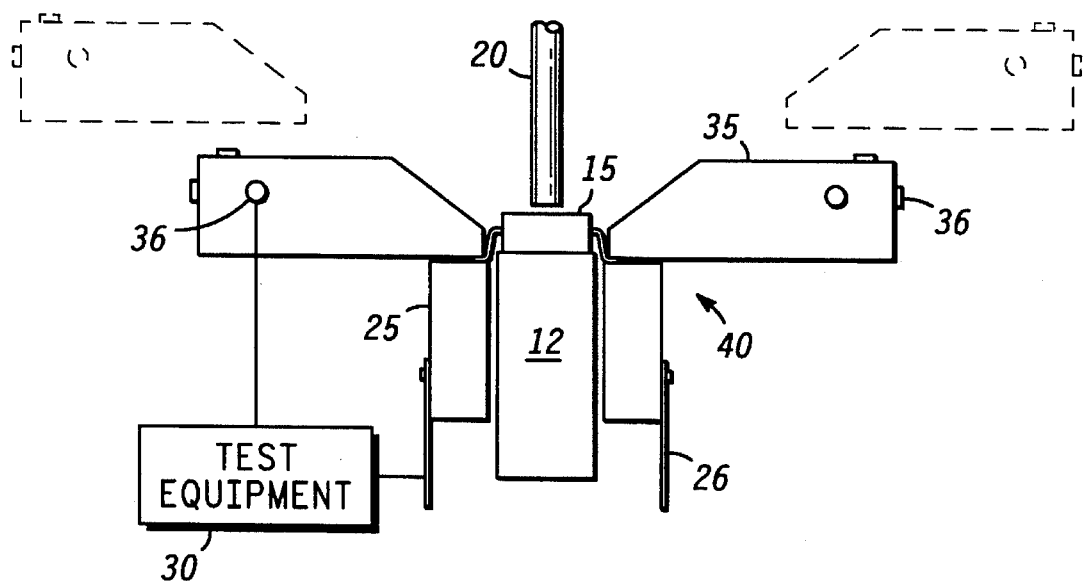
FIG. 4 is a front plan view of the testing station of FIG. 3, with semiconductor package in place, during lead forming and testing in accordance with the method of FIG. 2.

A plurality of lower contact blocks 25, one for each lead 17 of semiconductor package 15, are positioned adjacent the sides of support 12 and in a position to receive leads 17 to complete their form and position. Each lower contact block 25 has an electrical connection 26 associated therewith which is electrically connected to test equipment 30 (see FIG. 4). Also, lower contact blocks 25 are constructed to complete an electrical circuit between leads 17 of semiconductor package 15 and test equipment 30 when leads 17 are bent into contact with lower contact blocks 25. This can be accomplished by forming lower contact blocks 25 completely of a good electrical conductor or by providing an electrically conductive surface layer.

A plurality of upper contact members 35 are pivotally mounted adjacent support 12. Members 35 are mounted for vertical, diagonal, horizontal pivotal or rolling movement between a first or loading position (illustrated in FIG. 3) and a second position in which members 35 electrically contact and form, in cooperation with lower contact blocks 25, leads 17 (illustrated in FIG. 4). Plurality of members 35 include one member 35 for each lead 17 of semiconductor package 15 and an electrical connection 36 associated therewith which is electrically connected to test equipment 30. In this specific embodiment, each lower contact block 25 and associated upper contact member 35 cooperate to form a die 40 that bends a lead 17 into a desired and predetermined shape.

Generally, in this specific embodiment, member 35 rotates downwardly from the first toward the second position and, at some time during the downward movement, member 35 is also cammed inwardly to press leads 17 against contact blocks 25 or to the body of semiconductor package 15. It will of course be understood that the formation of different shapes of leads will require different shapes and/or positions for dies 40 and, in some instances different movements of components thereof.

Dies 40 are movably positioned adjacent support 12 for simultaneously contacting and forming leads 17. Further, in this specific embodiment both lower contact block 25 and upper contact member 35 of each die 40 electrically contacts leads 17 to ensure a constant and reliable electrical connection between leads 17 and test equipment 30. It will of course be understood that a single contact on the upper or lower surface of each lead 17 might be sufficient in some applications. Also, while station 10 is described herein as including a plurality of separate dies 40, it should be understood that a single die could be formed with electrical insulation between contacts for each lead 17. Also, in actual manufacturing and testing environments, a plurality of semiconductor packages may be operated upon in a single step.

Figure 5:
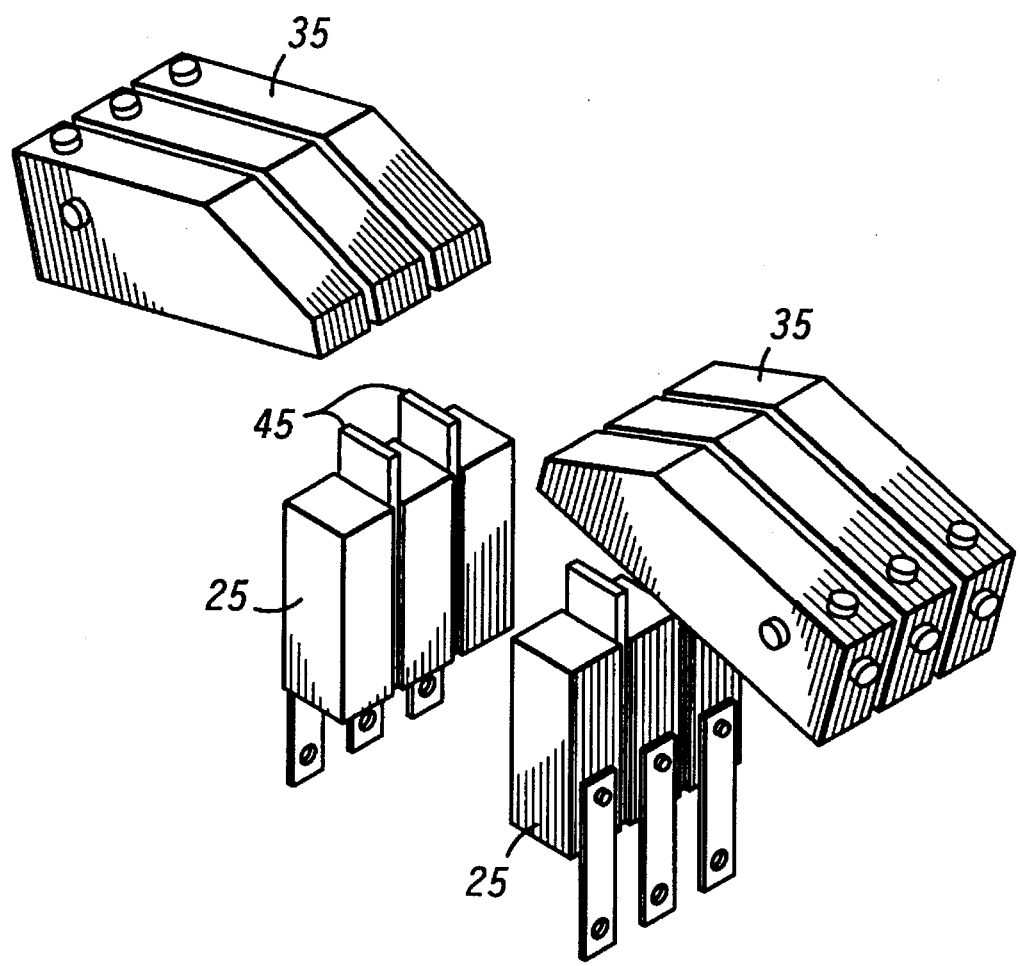
FIG. 5 is a perspective view of portions of the testing station of FIG. 3, illustrating the operating relationship.

Referring specifically to FIG. 5, lower contact blocks 25 and upper contact members 35 of dies 40 are illustrated in a perspective view to add to the understanding of the construction thereof. Here it can be seen that members 35 are essentially fingers with a 90° corner at the lower edge thereof and an insulating space or layer therebetween. Lower contact blocks 25 are formed with a layer of insulation 45 extending upwardly therebetween. Insulation 45 not only serves to electrically separate each lower contact block 25 from adjacent contact blocks 25, but also extends upwardly between members 35 when they are in the second position to guide the leads 17 to ensure lead spacing and also to assist removal of foreign matter from therebetween. It should be understood that the insulation can be positioned for upward and/or downward cleaning action. The contacting and forming process has a tendency to break off small particles of leads 17, which particles can collect in the spaces between members 35 and cause errors in the tests. Insulating layers 45 assist in removing these particles and ensure adequate and accurate testing for each semiconductor package.

Thus, semiconductor package 15 is completely tested and leads 17 are formed into the desired shape in one forming and testing final manufacturing step. Semiconductor package 15, of known quality, is moved directly into final outgoing packages, i.e. tape and reel, trays, magazines, shipping tubes, etc. A new and improved lead forming and package testing method is disclosed in which constant and reliable contact with the leads is made. Further, the new and improved lead forming and package testing method can quickly and efficiently detect failures caused by lead formation. Also, forming and testing time and expense is reduced and the improved lead forming and testing method substantially improves detection of lead forming as well as prior process induced failures, including intermittents. In addition, the new and improved lead forming and package testing method substantially reduces bending and surface marring of the leads out of specification during testing, and tested packages of known quality can be placed directly into final outgoing packages, i.e. tapes and reels, etc.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

We claim:

1. A method of forming leads and testing circuitry of a semiconductor package, comprising the steps of:

providing a semiconductor package including an electronic circuit therein, the package having leads electrically connected to the circuit; and contacting and testing the leads of the package with a contacting member for testing the package through an electrical path of the contacting member, and forming the leads with the contacting step by deformation from the contacting member.

2. A method of forming leads and testing circuitry of a semiconductor package as claimed in claim 1 including a step of at least partially testing the electronic circuit prior to the contacting step.

3. A method of forming leads and testing circuitry of a semiconductor package as claimed in claim 1 including the steps of providing a forming and testing station including a support for receiving the package and dies movably positioned adjacent the support for contacting and forming the leads, positioning the package on the support, and using the station for the contacting step.

4. A method of forming leads and testing circuitry of a semiconductor package as claimed in claim 3 including the steps of electrically connecting test equipment to the dies.

5. A method of forming leads and testing circuitry of a semiconductor package as claimed in claim 1 including the steps of final testing of the electronic circuit in the package, and placing the tested package with formed leads in a shipping package after the step of final testing.

6. A method of forming leads and testing circuitry of a semiconductor package, comprising the steps of:

providing a semiconductor package including an electronic circuit therein, the package having leads electrically connected to the circuit;

providing a forming and testing station including a support for receiving the package and dies movably positioned adjacent the support for contacting and forming the leads;

electrically connecting electronic circuit test equipment to the dies;

positioning the semiconductor package on the support; and contacting the leads of the package with the dies to connect the test equipment to the leads through an electrical path of the dies for testing the electronic circuit in the package, and forming the leads with the contacting step by deformation from the dies.

7. A lead forming and circuitry testing station comprising:

a support for receiving a semiconductor package thereon, the package including an electronic circuit and leads electrically connected to the circuit;

dies movably positioned adjacent the support for movement between a first or loading position and a second position in which the dies form and electrically contact the leads, wherein the dies form the leads by deformation; and test equipment electrically connected to the dies, wherein the dies provide an electrical path from the test equipment to the leads for testing the electronic circuit.

8. A lead forming and circuitry testing station as claimed in claim 7 wherein the support includes a central portion for receiving a body of the package and the station further including a step portion positioned adjacent the support so as to engage the dies in the second position and, in conjunction with the dies, form a step in the leads.

* * * * *